US009576818B2

(12) United States Patent
Miller et al.

(10) Patent No.: US 9,576,818 B2
(45) Date of Patent: Feb. 21, 2017

(54) POLISHING SLURRY FOR COBALT REMOVAL

(71) Applicant: FUJIMI INCORPORATED, Aichi (JP)

(72) Inventors: Anne Miller, Tualatin, OR (US);
Jimmy Granstrom, Tualatin, OR (US)

(73) Assignee: FUJIMI INCORPORATED, Aichi (JP)

( * ) Notice: Subject to any disclaimer, the term of this patent is extended or adjusted under 35 U.S.C. 154(b) by 122 days.

(21) Appl. No.: 14/192,630

(22) Filed: Feb. 27, 2014

(65) Prior Publication Data
US 2014/0243250 A1 Aug. 28, 2014

Related U.S. Application Data

(60) Provisional application No. 61/770,999, filed on Feb. 28, 2013.

(51) Int. Cl.
*H01L 21/02* (2006.01)
*H01L 21/321* (2006.01)
*C09K 3/14* (2006.01)

(52) U.S. Cl.
CPC ......... *H01L 21/3212* (2013.01); *C09K 3/1463* (2013.01)

(58) Field of Classification Search
CPC ............. H01L 21/3212; H01L 21/7684; C11D 11/0047
USPC .......................................... 510/175; 438/692
See application file for complete search history.

(56) References Cited

U.S. PATENT DOCUMENTS

| | | | | |
|---|---|---|---|---|
| 6,776,810 B1 * | 8/2004 | Cherian | ................ | B24B 37/044 106/3 |
| 7,306,637 B2 * | 12/2007 | Cherian | ................ | B24B 37/044 106/3 |
| 2003/0153184 A1 * | 8/2003 | Wang | ................... | H01L 21/3212 438/689 |
| 2005/0090104 A1 * | 4/2005 | Yang | ........................ | C09G 1/02 438/689 |
| 2007/0090094 A1 * | 4/2007 | Thompson | ............... | C09G 1/02 216/89 |
| 2007/0117497 A1 * | 5/2007 | Moeggenborg | ..... | B24B 37/0056 451/41 |
| 2007/0251155 A1 * | 11/2007 | Dysard | ................ | B24B 37/044 51/298 |
| 2009/0004863 A1 * | 1/2009 | Kamimura | ............... | C09G 1/02 438/692 |
| 2010/0112728 A1 * | 5/2010 | Korzenski | ......... | H01L 21/02079 438/3 |

FOREIGN PATENT DOCUMENTS

| | | |
|---|---|---|
| JP | 2005-277399 A | 10/2005 |
| JP | 2008-243857 A | 10/2008 |
| JP | 2009-087968 A | 4/2009 |
| JP | 2011-003665 A | 1/2011 |
| WO | WO-2013/112490 A1 | 8/2013 |
| WO | WO-2014/132641 A1 | 9/2014 |

OTHER PUBLICATIONS

International Preliminary Report on Patentability for International Patent Application No. PCT/JP2014/001026, dated Sep. 1, 2015 (English Translation).
Notification of Transmittal of Translation of the International Preliminary Report on Patentability for International Patent Application No. PCT/JP2014/001026, dated Sep. 11, 2015.

* cited by examiner

*Primary Examiner* — Gregory Webb
(74) *Attorney, Agent, or Firm* — Foley & Lardner LLP

(57) ABSTRACT

Provided herein are polishing compositions for removal of Co, for example, selectively over Cu, and methods of their use. A polishing composition comprising an abrasive and one or more Co complexors, where the polishing composition has a pH of 9 or more, and the Co complexor comprises one or more of functional groups selected from phosphonic acid (—P(=O)(OH)$_2$) group or carboxyl (—C(=O)OH) group.

25 Claims, No Drawings

POLISHING SLURRY FOR COBALT REMOVAL

CROSS REFERENCE TO RELATED APPLICATION

This application claims the benefit of U.S. Provisional Application No. 61/770,999, filed on Feb. 28, 2013, the disclosure of which is incorporated herein by reference in its entirety.

TECHNICAL FIELD

Provided herein are polishing compositions for cobalt (Co) removal, for example, selectively over copper (Cu), and methods of their use.

BACKGROUND ART

Typically, a semiconductor wafer has a wafer of silicon and a dielectric layer containing multiple trenches arranged to form a pattern for circuit interconnects within the dielectric layer. The pattern arrangements usually have a barrier layer covering the patterned dielectric layer and a metal layer covering the barrier layer. The metal layer has at least sufficient thickness to fill the patterned trenches with metal to form circuit interconnects. In most cases, in a chemical mechanical planarization or polishing (CMP) process, the metal layer is removed from underlying barrier layers, and in the next step, the barrier layer is removed. At the same time, the circuit wiring that is in a plane with respect to the polishing surface is provided with a smooth surface having metal filled trenches remaining on the wafer. In this step, the barrier layer remaining on the semiconductor wafer is removed from an underlying dielectric layer of the semiconductor wafer to provide a planar polished surface on the dielectric layer. In such a CMP process, Patent Literature 1 proposes a method of removing a metal layer (Cu) and barrier layer (Ta) effectively.

The metal layer usually includes Cu interconnects and the barrier layer is formed of Ta, nitride and so on. Together with the miniaturization in design rule, however, each layer formed in the circuit wiring forming step tends to be thinner. The layer of "Ta or TaN" used as a wiring material is thinner, thereby degrading the effect of preventing the diffusion of Cu and also degrading the adhesiveness with the Cu layer. Hence, as a substitute of the Ta (or TaN) layer, by interposing the Co (cobalt) layer adaptable to Cu between the Ta (or TaN) layer and the Cu layer, a step of compensating the adhesiveness with the upper layer with the diffusion of Cu being suppressed is produced. When selectively polishing and removing such a Co barrier layer from Cu interconnects, in addition to merely polishing and removing effectively, there is a demand for selectively polishing and removing the Co barrier layer from the Cu interconnections in a stable manner while suppressing the Co etching rate.

CITATION LIST

Patent Literature

Patent Literature 1: JP 2005-277399 A

SUMMARY OF INVENTION

Technical Problem

When polishing substrates including Cu interconnects and Co barriers, difficulties have arisen in achieving desirable removal rate for Co with low etch rates for Co. Provided herein are compositions and methods directed to overcoming such and related problems.

Solution to Problem

In one aspect of the present invention, provided herein is a polishing composition comprising an abrasive and one or more complexors, having a pH of 9 or more. The complexor comprises one or more of functional groups selected from phosphonic acid group (—P(=O)(OH)$_2$) or carboxyl group (—C(=O)OH).

In one aspect of the present invention, the complexor comprises of one or more of phosphonic derivatives, the phosphonic derivative comprises one or more phosphonic acid (—P(=O)(OH)$_2$) groups or salts thereof covalently attached independently by a bond or a linker to a core, the core is selected from a heteroatom or a $C_1$-$C_{20}$ hydrocarbyl moiety, wherein the hydrocarbyl moiety is optionally substituted with one or more of 1-5 heteroatoms and 1-5 hydroxyl groups, the linker is a divalent or trivalent heteroatom or a divalent or trivalent $C_1$-$C_{20}$ hydrocarbyl moiety, wherein the hydrocarbyl moiety is optionally substituted with one or more of 1-5 heteroatoms and 1-5 hydroxyl groups, and the heteroatom is independently selected from N, O, S, P and oxidized forms of N, S, and P.

In one aspect of the present invention, the Co complexor contains at least one of citric acid or a salt thereof, ethylenediamine tetraacetic acid (EDTA), 2-hydroxyphosphonic acid (HPAA), phosphonobutane-tricarboxylic acid (PBTC), or amino tri(methylenephosphonic acid) (ATMP). Further in one embodiment, the Co complexor is selected from citric acid, a salt thereof, or ethylenediamine tetraacetic acid (EDTA).

In one aspect of the present invention, the polishing composition further comprises ammonia, or bicarbonate or a salt thereof. In another embodiment, the polishing composition contains a complexor and is free of citric acid. In yet another embodiment, the polishing composition contains a complexor and is free of bicarbonate and a salt thereof. In yet another embodiment, the polishing composition contains a complexor and is free of both citric acid, bicarbonate and a salt thereof.

Without being bound by theory, the complexor should provide the polish removal rate by specifically complexing cobalt metal ions in solutions. Salts can act as removal rate enhancers by functioning as co-complexors and/or as electrolytes. For example, citric acid salts added at high pH may aid in complexing the cobalt in solution. Bicarbonate or salt thereof can act to compress the double layer around the particle and enhance the mechanical removal during polish. Similarly, salts of any complexor can also function as an electrolyte in solution.

In another aspect of the present invention, the phosphonic acid derivative further comprises one or more carboxylic acid groups or salts thereof. In another embodiment, the phosphonic acid derivative is a compound of formula (I)

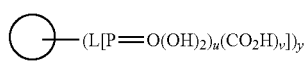

or a salt thereof wherein,

is the core,
each L independently is a bond or a linker, wherein the core and the linker are defined as above, each u independently is 0-3, each v independently is 0-3, and y is 1-5; provided that the derivative contains at least one phosphonic acid or salt thereof.

In another aspect of the present invention, the core is a heteroatom. In another aspect, the core is a hydrocarbyl moiety selected from an alkylene optionally substituted with 1-3 hydroxyl groups.

In another embodiment, the Co complexor is preferably present in an amount by mass of the polishing composition of equal to or less than 5%, equal to or less than 3%, equal to or less than 0.1%, or equal to or less than 0.01%.

DESCRIPTION OF EMBODIMENTS

Definitions

"a" or "an" include plural forms as the context indicates. For example, a complexor means one or more complexors.

"About" refers to ±1%, ±5%, or ±10% of a quantity, as the context indicates. As used herein, every quantity and ranges of each thereof are preceded by the term "about"

"Hydrocarbyl" refers to a moiety containing carbon and hydrogen atoms. The number of carbon atoms is typically 1-30 ($C_1$-$C_{30}$). Examples of hydrocarbyl groups include, without limitation, alkyl, alkenyl, alkynyl, aryl, cycloalkyl, alkylene and combinations thereof.

"Alkyl" refers to a saturated, linear or branched, monovalent hydrocarbyl moiety. The number of carbon atoms is typically 1-20.

"Alkenyl" refers to a linear or branched, monovalent hydrocarbyl moiety. The number of carbon atoms is typically 1-20, and up to 3 carbon-carbon double bonds are contained.

"Alkynyl" refers to a linear or branched, monovalent hydrocarbyl moiety. The number of carbon atoms is typically 1-20, and up to 3 carbon-carbon triple bonds are contained.

"Aryl" refers to an aromatic, cyclic hydrocarbyl moiety. The number of carbon atoms is typically 6-10.

"Cycloalkyl" refers to a cyclic, non-aromatic hydrocarbyl moiety containing 3-15 carbon atoms. Cycloalkyl can be completely saturated or partially unsaturated. A partially unsaturated cycloalkyl group contains 1-4 carbon-carbon double bonds.

"Alkylene" refers to a saturated, divalent, linear or branched hydrocarbyl moiety. The number of carbon atoms is typically 2-20.

In one embodiment, provided herein is a polishing composition comprising colloidal silica, a complexor, an oxidizing agent, a surfactant, and optionally a corrosion inhibitor, wherein: the complexor comprises of one or more of a phosphonic acid derivative, ammonia, and ethylenediamine tetraacetic acid (EDTA), and further optionally comprises citric acid or bicarbonate, wherein the phosphonic acid derivative comprises: one or more phosphonic acid (—P(=O)(OH)$_2$) groups or salts thereof covalently attached independently by a bond or a linker to a core, the core is selected from a heteroatom or a $C_1$-$C_{20}$ hydrocarbyl moiety, wherein the hydrocarbyl moiety is optionally substituted with 1-5 heteroatoms and/or 1-5 hydroxyl groups, the linker is a divalent or trivalent heteroatom or a divalent or trivalent $C_1$-$C_{20}$ hydrocarbyl moiety, wherein the hydrocarbyl moiety is optionally substituted with 1-5 heteroatoms and/or 1-5 hydroxyl groups, and the heteroatom is independently selected from N, O, S, P and oxidized forms thereof.

In one embodiment, the polishing composition optionally comprises ammonia, bicarbonate, citric acid or salts thereof, glycine, arginine, or cysteine as a Co removal rate enhancer. In another embodiment, the polishing composition is free of citric acid. In yet another embodiment, the polishing composition is free of bicarbonate. In yet another embodiment, the polishing composition is free of both citric acid and bicarbonate. In one embodiment, an amount by mass of citric acid (or bicarbonate) is less than 0.001%, less than 0.0001%, or less than 0.00001%.

In another embodiment, the phosphonic acid derivative further comprises one or more carboxylic acid groups or salts thereof. In another embodiment, the phosphonic acid derivative is a compound of formula (I)

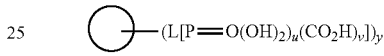

(I)

or a salt thereof wherein,

is the core,
each L independently is a bond or a linker, wherein the core and the linker are defined as above, each u independently is 0-3, each v independently is 0-3, and y is 1-5; provided that the derivative contains at least one phosphonic acid or salt thereof.

In one embodiment, the complexor is selected from the group consisting of: AEPn: 2-Aminoethylphosphonic acid, DMMP: Dimethyl methylphosphonate, HEDP: 1-Hydroxy Ethylidene-1,1-Diphosphonic Acid, ATMP: Amino tris(methylene phosphonic acid), EDTMP: Ethylenediamine tetra(methylene phosphonic acid), TDTMP: Tetramethylenediamine tetra(methylene phosphonic acid), HDTMP: Hexamethylenediamine tetra(methylene phosphonic acid), DTPMP: Diethylenetriamine penta(methylene phosphonic acid), PBTC: Phosphonobutane-tricarboxylic acid, PMIDA: N-(phosphonomethyl)iminodiacetic acid, CEPA: 2-carboxyethyl phosphonic acid, HPAA: 2-Hydroxyphosphonocarboxylic acid, AMP: Amino-tris-(methylene-phosphonic acid), PMG: N,N-bis(phosphonomethyl)glycine (glyphosine), IDMP: Iminodimethylenephosphonic acid, and EDTPO: Ethylene Diamine Tetra(Methylene Phosphonic Acid), or a salt thereof. Some complexors useful in some embodiments of this invention is structurally shown below:

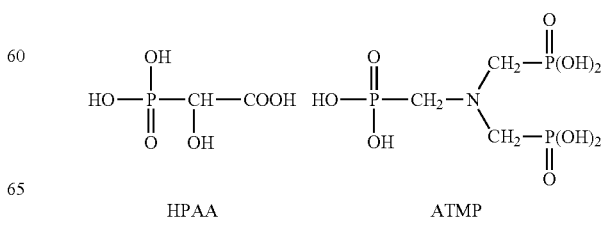

HPAA                ATMP

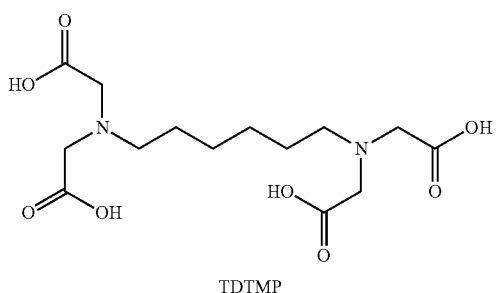

TDTMP

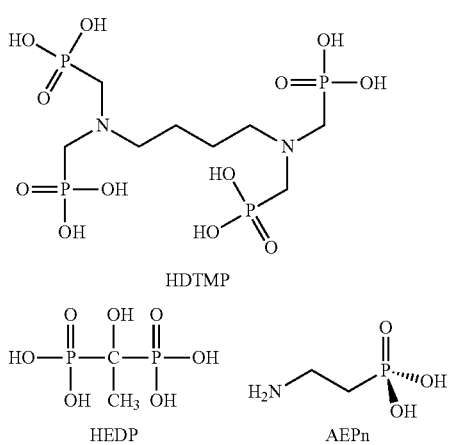

HDTMP

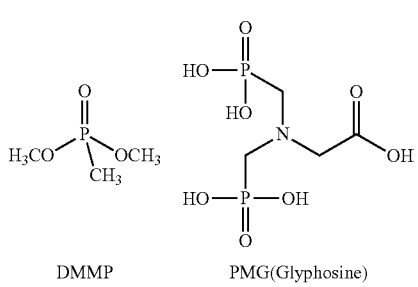

HEDP       AEPn

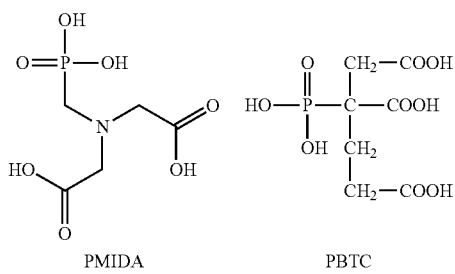

DMMP       PMG(Glyphosine)

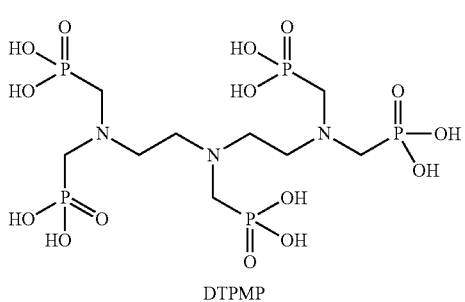

PMIDA       PBTC

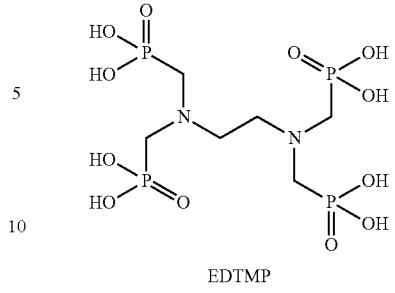

DTPMP

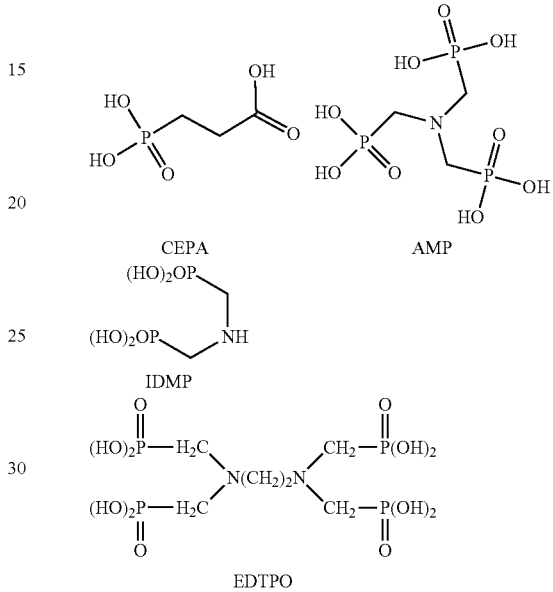

EDTMP

CEPA       AMP

IDMP

EDTPO

In another embodiment, the core is a heteroatom. In another embodiment, the core is a hydrocarbyl moiety selected from an alkylene optionally substituted with 1-3 hydroxyl groups.

In another embodiment, the phosphonate derivative as a Co complexor preferably has a low molecular weight. More specifically, the molecular weight of the Co complexor is preferably equal to or less than 350.00 g/mol, more preferably equal to or less than 300.00 g/mol, and still more preferably equal to or less than 280.00 g/mol. When the molecular weight is equal to or less than 350.00 g/mol, it tends to realize both a Co removal rate in a practical level and an etching suppression effect.

In another embodiment, the phosphonate derivative as a Co complexor preferably contains three or less phosphonate (—P(=O)(OH)$_2$) groups. When the number of the phosphonate (—P(=O)(OH)$_2$) groups is equal to or less than three, the Co removal rate tends to increase.

In another embodiment, the Co complexor contains citric acid or a salt thereof, EDTA, 2-hydroxyphosphonic acid (HPAA), phosphonobutane-tricarboxylic acid (PBTC), or amino tri(methylenephosphonic acid) (ATMP), and further optionally contains ammonia, bicarbonate or a salt thereof, glycine, arginine or cysteine.

In another embodiment, the Co complexor is preferably present in an amount by mass of the polishing composition of equal to or less than 5%, more preferably present in an amount of equal to or less than 3%, and still more preferably present in an amount of equal to or less than 1%. When an amount of the Co complexor is more than 5%, the Co etching speed tends to increase.

In another embodiment, the optionally contained Co removal rate enhancer is preferably present in an amount by mass of the polishing composition of equal to or less than 5%, more preferably present in an amount of equal to or less than 3%, and still more preferably present in an amount of equal to or less than 1%. When an amount of the Co removal rate enhancer is more than 5%, the Co etching speed tends to increase.

In another embodiment, the abrasive is silica, such as, without limitation, colloidal silica, alumina, ceria, or the like. Among the abrasives, colloidal silica is preferably used. The abrasive is preferably present in an amount by mass of the polishing composition of equal to or greater than 0.1%, more preferably present in an amount of equal to or greater than 0.5%, and still more preferably present in an amount of equal to or greater than 1.0%. Since a mechanical effect is enhanced as the amount of the abrasive increases, the Co removal rate tends to be enhanced. In addition, the abrasive is preferably present in an amount by mass of the polishing composition of equal to or less than 20%, and more preferably present in an amount of equal to or less than 10%. A dispersion property of the abrasive in the polishing composition tends to be enhanced as the amount of the abrasive decreases.

In another embodiment, an average primary particle size of the abrasive is preferably equal to or greater than 5 nm, more preferably equal to or greater than 7 nm, and still more preferably equal to or greater than 10 nm. The Co removal rate tends to increase as the average primary particle size of the abrasive increases. In addition, a value of the average primary particle size of the abrasive can be calculated based on a specific surface area of the abrasive measured by the BET method. The average primary particle size of the abrasive is preferably equal to or less than 150 nm, more preferably equal to or less than 110 nm, and still more preferably equal to or less than 100 nm. It tends to facilitate obtaining a polishing surface with fewer defects such as scratches by polishing a polishing target as the average primary particle size of the abrasive decreases.

In another embodiment, an average secondary particle size of the abrasive is preferably equal to or less than 300 nm, more preferably equal to or less than 270 nm, and still more preferably equal to or less than 250 nm. It tends to facilitate obtaining a polishing surface with fewer defects such as scratches by polishing a polishing target as the average secondary particle size of the abrasive decreases. A value of the average secondary particle size of the abrasive can be measured by the laser scattering method.

In another embodiment, the shape of the abrasive may be a spherical shape (spherical) or a non-spherical shape. Examples of the non-spherical shape include a so-called cocoon shape (cocoon) with a constricted part provided at the center, a confetti shape with a surface including a plurality of projections, a rugby ball shape, and an aggregate shape (aggregate). The abrasive with a non-spherical shape may be an association of primary particles.

In another embodiment, the polishing composition further comprises one or more of an oxidizing agent (or oxidant), a corrosion inhibitor, and a surfactant.

In another embodiment, the oxidant is preferably present in an amount by mass of the polishing composition of equal to or greater than 0.1%, and still more preferably present in an amount of equal to or greater than 0.5%. In addition, the oxidant is preferably present in an amount by mass of the polishing composition of equal to or less than 4%, and more preferably present in an amount of equal to or less than 3%. When the amount of the oxidant is less than 0.1% or exceeds 4%, it tends to be difficult to obtain the Co removal rate in a practical level. Non-exclusive examples of the oxidant include $H_2O_2$, persulfate, nitric acid, potassium periodate, hypochlorous acid, and ozone water. In another embodiment, the oxidant is $H_2O_2$.

In another embodiment, the corrosion inhibitor is preferably present in an amount by mass of the polishing composition of equal to or greater than 0.1%, and more preferably present in an amount of equal to or greater than 0.2%. In addition, the corrosion inhibitor is preferably present in an amount by mass of the polishing composition of equal to or less than 0.4% and more preferably equal to or less than 0.3%. If the amount of the corrosion inhibitor is less than 0.1% or exceeds 0.4%, it tends to be difficult to obtain a corrosion suppression effect in a practical level. In another embodiment, the corrosion inhibitor is a heterocyclic or complex aryl compound containing at least a five or six-membered ring, two or more double bonds, and one or more nitrogen atoms. Non-exclusive examples include a compound containing a pyridine ring, a pyrazole ring, a pyrimidine ring, an imidazole ring, and a triazole ring or a benotriazole ring. In another embodiment, the corrosion inhibition factor is a benzotriazole (BTA).

In another embodiment, the surfactant is preferably present in an amount by mass of the polishing composition of equal to or greater than 0.01%, and more preferably present in an amount of equal to or greater than 0.02%. In addition, the surfactant is preferably present in an amount by mass of the polishing composition of equal to or less than 2%, and more preferably present in an amount of equal to or less than 1%. In another embodiment the surfactant is configured of the compound represented by the following Formula (II).

$$R^1-O-[CH_2CH(CH_3)O]_m-[CH_2CH_2O]_n-H \qquad (II)$$

wherein $R^1$ is $C_1$-$C_{10}$ alkyl, m and n are chosen such that in the compound of formula II, oxyethylene and oxypropylene groups are present in a 1:1 amount by weight to about 3:1 amount by weight. In one embodiment, the surfactant comprises polyethylene glycol alkyl ether and/or polypropylene glycol alkyl ether.

In another embodiment, the pH of the polishing composition is preferably greater than 9, more preferably equal to or greater than 9.5, and still more preferably equal to or greater than 10.0. In addition, pH of the polishing composition is preferably equal to or less than 14, and more preferably equal to or less than 12. If pH of the polishing composition is less than 9 or more than 14, it tends to be difficult to realize both the Co removal rate in a practical level and the etching suppression effect. The pH is maintained using acids, or bases such as ammonia, alkali, organic bases, carbonate, or bicarbonate, optionally a buffer. A variety of acids, including organic and inorganic acids and buffers, including without limitation, acidic, neutral and alkaline buffers are useful for this purpose. Without being bound by theory, at a pH of 9 or more, cobalt static etch approaches zero due to the protective nature of the cobalt hydroxide film formed during polish. Typically, metal CMP processes are developed to ensure a high polish removal rate while maintaining a low etch rate.

In another embodiment, provided herein is a method of polishing, the method comprising polishing Co optionally in the presence of Cu with a composition provided herein. In one embodiment, the removal rate of Co is 200 angstrom/min to 2000 angstrom/min or 200 angstrom/min to 2400 angstrom/min. In another embodiment, the removal rate of Cu is less than 100 angstrom/min, or less than 80 angstrom/min. In another embodiment, the Co:Cu removal selectivity is 5 or more, 10 or more, or 15 or more. Co:Cu selectivity is determined by dividing the Co removal rate with the Cu removal rate, i.e. selectivity =RR(Co)/RR(Cu). Due to measurements sensitivity, Cu removal rates below 100 angstrom/min are approximated to be 100 angstrom/min, thus, the determined Co/Cu selectivities may be even higher than those provided herein.

Other Additives

According to some embodiments, the polishing composition may contain an antiseptic or an antifungal agent. Non-exclusive examples of the antiseptic and the antifungal agents include 2-methyl-4-isothiazoline-3-one and isothiazoline-based antiseptics such as 5-chloro-methyl-4-isothiazoline-3-one, p-hydroxybenzoate, and phenoxyethanol.

According to some embodiments, the polishing composition used for polishing is prepared by diluting undiluted solution (concentrate) of the polishing composition to a concentration from two times to ten times by using a diluting fluid such as aqueous solution or water.

General Procedure for Preparing Composition and Measuring Removal Rate

Generally, the abrasive and the Co complexor are blended in water, and pH of the composition is appropriately adjusted by a pH adjuster (such as potassium hydrate or ammonia). Although a temperature when the respective constituents are blended is not particularly limited, the temperature is preferably from 10° C. to 40° C., and heating may be performed for an increase in a speed of dissolution. In addition, the blending time is not particularly limited.

As a polishing apparatus, it is possible to use a general polishing apparatus, to which a holder for holding a substrate with a polishing target, a motor capable of rotating in different numbers of rotations, and the like are attached, which includes a polishing disk with an attachable polishing pad (polishing cloth).

Polishing conditions are not particularly limited, and for example, the rotation speed of the polishing disk is preferably from 10 rpm to 500 rpm, and the pressure (polishing pressure) to be applied to the substrate with the polishing target is preferably from 0.5 psi to 10 psi. A method of supplying the polishing composition to the polishing pad is not particularly limited, and for example, a method of sequentially supplying the polishing composition with a pump or the like is employed. Although the supply amount thereof is not particularly limited, it is preferable that the surface of the polishing pad be constantly covered with the polishing composition of embodiments of the present invention.

The substrate is obtained by washing the substrate with flowing water after the polishing, blowing water droplets adhering to the substrate, and drying the substrate with a spin drier or the like.

The wafer is polished for a predetermined time, and a surface removal rate of other wafers such as Co described in the Examples is measured. The removal rate is calculated by measuring a difference in the wafer thicknesses before and after the polishing and the polishing time. The differences in thickness are measured by using an optical interferometer film thickness measurement apparatus, for example.

EXAMPLES

Example 1

The surface of Co wafers having a diameter of 200 mm was polished with each of samples 1 to 12 of embodiments of this disclosure and comparative samples 1 to 9 shown in Table 1 as a polishing composition at a slurry flow rate of the polishing composition of 200 mL/min, a pressure of polishing of 2 psi, and a platen rotation speed of 127 rpm, while using a soft polymeric polyurethane pad. The removal rate of each of the wafers is shown in Table 1. Note that the term "slurry flow rate of the polishing composition" means a total supply amount of all the supplied liquids per unit time (which will equally apply to examples described below). In addition, the average primary particle size of the colloidal silica is 35 nm, the average secondary particle size of the same is 70 nm, and potassium hydroxide is used as a pH adjuster in Example 1.

It has been found that it is possible to polish Co effectively while lowering a Co etching rate by using the samples 1 to 12 according to embodiments of the present invention. In contrast, a Co etching rate is high in case of comparative samples 1 to 4, 7 and 8, a Co removal rate is not increased in case of comparative samples 5 and 9, a Co removal rate and a Co etching rate is largely fluctuating in unstable manner in case of comparative sample 6.

TABLE 1

| polishing experiments | Abrasive | % | Cobalt Complexor compound(s) | % | additive compound(s) | % | Inhibitor (if present) | % | Oxidizing Agent | % | Surfactant | % | pH* | Cobalt Removable Rate (Å/min) | Cobalt Etching Rate (Å/min) |
|---|---|---|---|---|---|---|---|---|---|---|---|---|---|---|---|
| Ex. 1 | Colloidal Silica | 2 | citric acid | 0.5 | ammonia | 0.6 | BTA | 0.2 | $H_2O_2$ | 0.6 | polypropylene glycol butyl ether | 0.05 | 10 | 235.000 | 2.136 |
| Ex. 2 | Colloidal Silica | 2 | citric acid | 0.5 | None | — | BTA | 0.2 | $H_2O_2$ | 0.6 | polypropylene glycol butyl ether | 0.05 | 10 | 133.000 | 7.693 |
| Ex. 3 | Colloidal Silica | 2 | citric acid/ EDTA | 0.5/0.6 | None | — | BTA | 0.2 | $H_2O_2$ | 0.6 | polypropylene glycol butyl ether | 0.05 | 10 | 362.000 | 9.766 |
| Ex. 4 | Colloidal Silica | 2 | EDTA | 0.6 | None | — | BTA | 0.2 | $H_2O_2$ | 0.6 | polypropylene glycol butyl ether | 0.05 | 10 | 80.000 | 4.149 |
| Ex. 5 | Colloidal Silica | 2 | HPAA/ citric acid | 0.6/0.5 | None | — | BTA | 0.2 | $H_2O_2$ | 0.6 | polypropylene glycol butyl ether | 0.05 | 10 | 1616.000 | 3.500 |
| Ex. 6 | Colloidal Silica | 2 | HPAA | 0.6 | None | — | BTA | 0.2 | $H_2O_2$ | 0.6 | polypropylene glycol butyl ether | 0.05 | 10 | 1011.000 | 4.248 |
| Ex. 7 | Colloidal Silica | 2 | citric acid | 0.5 | Glycine | 0.6 | BTA | 0.2 | $H_2O_2$ | 0.6 | polypropylene glycol butyl ether | 0.05 | 10 | 214.000 | 2.048 |

TABLE 1-continued

| polishing experiments | Abrasive | % | Cobalt Complexor compound(s) | % | additive compound(s) | % | Inhibitor (if present) | % | Oxidizing Agent | % | Surfactant | % | pH* | Cobalt Removable Rate (Å/min) | Cobalt Etching Rate (Å/min) |
|---|---|---|---|---|---|---|---|---|---|---|---|---|---|---|---|
| Ex. 8 | Colloidal Silica | 2 | citric acid | 0.5 | Arginine | 0.6 | BTA | 0.2 | $H_2O_2$ | 0.6 | polypropylene glycol butyl ether | 0.05 | 10 | 129.000 | 1.495 |
| Ex. 9 | Colloidal Silica | 2 | citric acid | 0.5 | Cystein | 0.6 | BTA | 0.2 | $H_2O_2$ | 0.6 | polypropylene glycol butyl ether | 0.05 | 10 | 85.000 | 4.034 |
| Ex. 10 | Colloidal Silica | 2 | ATMP/ citric acid | 0.6/0.5 | None | — | BTA | 0.2 | $H_2O_2$ | 0.6 | polypropylene glycol butyl ether | 0.05 | 10 | 532.000 | 0.790 |
| Ex. 11 | Colloidal Silica | 2 | HPAA | 0.6 | Bicarbonate | 0.5 | BTA | 0.2 | $H_2O_2$ | 0.6 | polypropylene glycol butyl ether | 0.05 | 10 | 2005.700 | 3.116 |
| Ex. 12 | Colloidal Silica | 2 | ATMP | 0.6 | Bicarbonate | 0.5 | BTA | 0.2 | $H_2O_2$ | 0.6 | polypropylene glycol butyl ether | 0.05 | 10 | 741.000 | 1.320 |
| Com. 1 | Colloidal Silica | 2 | HPAA | 0.6 | None | — | BTA | 0.2 | $H_2O_2$ | 0.6 | polypropylene glycol butyl ether | 0.05 | 7 | 196.850 | 99.360 |
| Com. 2 | Colloidal Silica | 2 | HPAA | 0.6 | None | — | BTA | 0.2 | $H_2O_2$ | 0.6 | polypropylene glycol butyl ether | 0.05 | 3 | 3288.800 | 108.180 |
| Com. 3 | Colloidal Silica | 2 | HPAA/ citric acid | 0.5/0.6 | None | — | BTA | 0.2 | $H_2O_2$ | 0.6 | polypropylene glycol butyl ether | 0.05 | 7 | 2070.735 | 101.460 |
| Com. 4 | Colloidal Silica | 2 | HPAA/ citric acid | 0.5/0.6 | None | — | BTA | 0.2 | $H_2O_2$ | 0.6 | polypropylene glycol butyl ether | 0.05 | 3 | 3998.000 | 239.730 |
| Com. 5 | Colloidal Silica | 2 | None | — | ammonia | 0.6 | BTA | 0.2 | $H_2O_2$ | 0.6 | polypropylene glycol butyl ether | 0.05 | 10 | 67.000 | 1.704 |
| Com. 6 | Colloidal Silica | 2 | None | — | None | — | BTA | 0.2 | $H_2O_2$ | 0.6 | polypropylene glycol butyl ether | 0.05 | 10 | 0-160 (large fluctuations) | 13.31-29.6 (large scatter) |
| Com. 7 | Colloidal Silica | 2 | citric acid | 0.6 | None | — | BTA | 0.2 | $H_2O_2$ | 0.6 | polypropylene glycol butyl ether | 0.05 | 3 | 3316.000 | 135.200 |
| Com. 8 | Colloidal Silica | 2 | citric acid | 3.7 | ammonia | 0.6 | BTA | 0.2 | $H_2O_2$ | 0.6 | polypropylene glycol butyl ether | 0.05 | 8 | 2842.000 | 326.180 |
| Com. 9 | Colloidal Silica | 2 | None | — | Bicarbonate | 0.5 | BTA | 0.2 | $H_2O_2$ | 0.6 | polypropylene glycol butyl ether | 0.05 | 10 | 32.970 | 0.723 |

Example 2

The surface of Cu, Co, Ta, tetraethyl orthosilicate (TEOS) and Black Diamond™ (BD) as a Low-k dielectric material wafers having a diameter of 200 mm was polished with each of samples 13 to 20 of embodiments of this disclosure shown in Table 2 as a polishing composition at a slurry flow rate of the polishing composition of 200 mL/min, a pressure of polishing of 2 psi, and a platen rotation speed of 127 rpm, while using a soft polymeric polyurethane pad. The removal rate of each of the wafers is shown in Table 3. Note that the average primary particle size of the colloidal silica is 35 nm, the average secondary particle size of the same is 70 nm, and potassium hydroxide is used as a pH adjuster in Example 2.

It has been particularly found that high Co polishing rate ratio over Cu can be obtained. It has been particularly found when a molecular mass of the Co complexor is small, high Co polishing rate ratio over Cu can be obtained. In addition when 2 or more of Co complexors or a Co removal rate enhancer is contained, high Co polishing rate and high Co polishing rate ratio over Cu can be obtained.

TABLE 2

| polishing experiments | Abrasive | % | Cobalt Complexor compound(s) | % | Cobalt R.R. enhancer compound(s) | % | Inhibitor compound(s) | % | Oxidizing Agent compound(s) | % | Surfactant compound(s) | % | pH* |
|---|---|---|---|---|---|---|---|---|---|---|---|---|---|
| Ex. 13 | Colloidal Silica | 2 | HPAA | 0.6 | ammonia | 0.6 | BTA | 0.2 | $H_2O_2$ | 0.6 | polypropylene glycol butyl ether | 0.05 | 10 |
| Ex. 14 | Colloidal Silica | 2 | HPAA/ EDTA | 0.6/0.5 | None | — | BTA | 0.2 | $H_2O_2$ | 0.6 | polypropylene glycol butyl ether | 0.05 | 10 |
| Ex. 15 | Colloidal Silica | 2 | HPAA/ citric acid | 0.6/0.5 | None | — | BTA | 0.2 | $H_2O_2$ | 0.6 | polypropylene glycol butyl ether | 0.05 | 10 |
| Ex. 16 | Colloidal Silica | 2 | ATMP | 0.6 | ammonia | 0.6 | BTA | 0.2 | $H_2O_2$ | 0.6 | polypropylene glycol butyl ether | 0.05 | 10 |

TABLE 2-continued

| polishing experiments | Abrasive | % | Cobalt Complexor compound(s) | % | Cobalt R.R. enhancer compound(s) | % | Inhibitor compound(s) | % | Oxidizing Agent compound(s) | % | Surfactant compound(s) | % | pH* |
|---|---|---|---|---|---|---|---|---|---|---|---|---|---|
| Ex. 17 | Colloidal Silica | 2 | ATMP/ EDTA | 0.6/0.5 | None | — | BTA | 0.2 | $H_2O_2$ | 0.6 | polypropylene glycol butyl ether | 0.05 | 10 |
| Ex. 18 | Colloidal Silica | 2 | PBTC | 0.6 | ammonia | 0.6 | BTA | 0.2 | $H_2O_2$ | 0.6 | polypropylene glycol butyl ether | 0.05 | 10 |
| Ex. 19 | Colloidal Silica | 2 | PBTC/ EDTA | 0.6/0.5 | None | — | BTA | 0.2 | $H_2O_2$ | 0.6 | polypropylene glycol butyl ether | 0.05 | 10 |
| Ex. 20 | Colloidal Silica | 2 | PBTC/ citric acid | 0.6/0.5 | None | — | BTA | 0.2 | $H_2O_2$ | 0.6 | polypropylene glycol butyl ether | 0.05 | 10 |

TABLE 3

Effect

| polishing experiments | Cu Removable Rate (Å/min) | Co Removable Rate (Å/min) | Ta Removable Rate (Å/min) | TEOS Removable Rate (Å/min) | BD Removable Rate (Å/min) |
|---|---|---|---|---|---|
| Ex. 13 | 172 | 1934 | 462 | 309 | 133 |
| Ex. 14 | 66 | 2360 | 713 | 279 | 124 |
| Ex. 15 | 177 | 2544 | 868 | 366 | 112 |

TABLE 3-continued

Effect

| polishing experiments | Cu Removable Rate (Å/min) | Co Removable Rate (Å/min) | Ta Removable Rate (Å/min) | TEOS Removable Rate (Å/min) | BD Removable Rate (Å/min) |
|---|---|---|---|---|---|
| Ex. 16 | 68 | 669 | 522 | 276 | 87 |
| Ex. 17 | 45 | 446 | 556 | 347 | 124 |
| Ex. 18 | 81 | 994 | 396 | 243 | 97 |
| Ex. 19 | 52 | 201 | 541 | 541 | 135 |
| Ex. 20 | 104 | 618 | 512 | 385 | 185 |

Example 3

The surface of Cu, Co, Ta, tetraethyl orthosilicate (TEOS) and BD as a Low-k dielectric material wafers having a diameter of 200 mm was polished with each of samples 21 and 22 of embodiments of this disclosure shown in Table 4 as a polishing composition at a slurry flow rate of the polishing composition of 200 mL/min, a pressure of polishing of 2 psi, and a platen rotation speed of 127 rpm, while using a soft polymeric polyurethane pad. The removal rate of each of the wafers is shown in Table 5. Note that the average primary particle size of the colloidal silica is 35 nm, the average secondary particle size of the same is 70 nm, and potassium hydroxide is used as a pH adjuster in Example 3.

It has been particularly found that high Co polishing rate ratio over Cu can be obtained by using the polishing composition according to embodiments of the invention. It has been further found even when ammonia is added as a Co removal rate enhancer and also functions as a compound for pH adjusting, high Co polishing rate and high Co polishing rate ratio over Cu can be obtained.

TABLE 4

| polishing experiments | Abrasive | % | Cobalt Complexor compound(s) | % | Cobalt R.R. enhancer compound(s) | % | Inhibitor compound(s) | % | Oxidizing Agent compound(s) | % | Surfactant compound(s) | % | pH | pH adjuster |
|---|---|---|---|---|---|---|---|---|---|---|---|---|---|---|
| Ex. 21 | Colloidal Silica | 2 | HPAA/ citric acid | 0.6/0.5 | None | — | BTA | 0.2 | $H_2O_2$ | 0.6 | polypropylene glycol butyl ether | 0.05 | 10 | KOH |
| Ex. 22 | Colloidal Silica | 2 | HPAA | 0.6 | ammonia | 1.2 | BTA | 0.2 | $H_2O_2$ | 0.6 | polypropylene glycol butyl ether | 0.05 | 10 | (ammonia as Co R.R. enhancer) |

TABLE 5

Effect

| polishing experiments | Cu Removable Rate (Å/min) | Co Removable Rate (Å/min) | Ta Removable Rate (Å/min) | TEOS Removable Rate (Å/min) | BD Removable Rate (Å/min) |
|---|---|---|---|---|---|
| Ex. 21 | 41 | 806 | 141 | 108 | 43 |
| Ex. 22 | 1835 | 3045 | 116 | 0.1 | 72 |

Example 4

The surface of Cu, Co, Ta, TEOS and BD wafers having a diameter of 200 mm was polished with each of samples 1 to 12 shown in Table 1 and comparative samples 23 to 27 shown in Table 6 as a polishing composition at a slurry flow rate of the polishing composition of 200 mL/min, a pressure of polishing of 2 psi, and a platen rotation speed of 127 rpm, while using a soft polymeric polyurethane pad. The removal rate of each of the wafers is shown in Table 7.

It has been particularly found that high Co polishing rate ratio over Cu can be obtained by using the polishing composition according to embodiments of the invention.

TABLE 6

| | | | Contents | | | | | | | | | | | |
|---|---|---|---|---|---|---|---|---|---|---|---|---|---|---|
| | | abrasive | | | | | | | | | | | | |
| polishing experiments | Abrasive | % | primary particle size (nm) | secondary particle size (nm) | Cobalt Complexor compound(s) | % | Cobalt R.R. enhancer compound(s) | % | Inhibitor compound(s) | % | Oxidizing Agent compound(s) | % | Surfactant compound(s) | % | pH* |
| Ex. 23 | Colloidal Silica | 2 | 35 | 70 | HPAA/citric acid | 0.6/0.5 | None | — | BTA | 0.2 | $H_2O_2$ | 0.6 | polypropylene glycol butyl ether | 0.05 | 10 |
| Ex. 24 | Colloidal Silica | 2 | 12 | 33 | HPAA/citric acid | 0.6/0.5 | None | — | BTA | 0.2 | $H_2O_2$ | 0.6 | polypropylene glycol butyl ether | 0.05 | 10 |
| Ex. 25 | Colloidal Silica | 2 | 90 | 218 | HPAA/citric acid | 0.6/0.5 | None | — | BTA | 0.2 | $H_2O_2$ | 0.6 | polypropylene glycol butyl ether | 0.05 | 10 |
| Ex. 26 | Colloidal Silica | 2 | 35 | 55 | HPAA/citric acid | 0.6/0.5 | None | — | BTA | 0.2 | $H_2O_2$ | 0.6 | polypropylene glycol butyl ether | 0.05 | 10 |
| Ex. 27 | Colloidal Silica | 2 | 30 | 80 | HPAA/citric acid | 0.6/0.5 | None | — | BTA | 0.2 | $H_2O_2$ | 0.6 | polypropylene glycol butyl ether | 0.05 | 10 |

TABLE 7

| | Effect | | | | |
|---|---|---|---|---|---|
| polishing experiments | Cu Removable Rate (Å/min) | Co Removable Rate (Å/min) | Ta Removable Rate (Å/min) | TEOS Removable Rate (Å/min) | BD Removable Rate (Å/min) |
| Ex. 23 | 84 | 1749 | 665 | 430 | 157 |
| Ex. 24 | 40 | 425 | 350 | 10 | 135 |
| Ex. 25 | 99 | 1361 | 559 | 398 | 168 |
| Ex. 26 | 90 | 675 | 336 | 219 | 250 |
| Ex. 27 | 79 | 1118 | 343 | 372 | 141 |

The invention claimed is:

1. A polishing composition for polishing Co or a Co containing substrate, the composition comprising an abrasive; at least one Co complexor; ammonia; and bicarbonate; wherein
the polishing composition has a pH of 9 or more, and
the Co complexor comprises at least one selected from a group of 2-Aminoethylphosphonic acid (AEPn), Dimethyl methylphosphonate (DMMP), Tetramethylenediamine tetra(methylene phosphonic acid) (TDTMP), N-(phosphonomethyl)iminodiacetic acid (PMIDA), 2-carboxyethyl phosphonic acid (CEPA), 2-Hydroxyphosphonocarboxylic acid (HPAA), N,N-bis(phosphonomethyl)glycine (glyphosine) (PMG), Iminodimethylenephosphonic acid (IDMP), 2-hydroxyphosphonoacetic acid (HPAA), and amino tri(methylenephosphonic acid) (ATMP) or a salt of each thereof.

2. The polishing composition of claim 1, wherein the complexor is present in an amount by weight of the polishing composition of less than or equal to 5%.

3. The polishing composition of claim 1, wherein the abrasive is silica, alumina, or ceria.

4. The polishing composition of claim 1, further comprising at least one of an oxidizing agent, a surfactant, and a corrosion inhibitor.

5. The polishing composition of claim 4, wherein the oxidizing agent is present in an amount by weight of the polishing composition of 0.1-4%.

6. The polishing composition of claim 4, wherein the oxidizing agent is $H_2O_2$.

7. The polishing composition of claim 4, wherein the corrosion inhibitor is present in an amount by weight of the polishing composition of 0.1-0.4%.

8. The polishing composition of claim 4, wherein the corrosion inhibitor is benzotriazole (BTA).

9. The polishing composition of claim 4, wherein the surfactant is present in an amount by weight of the polishing composition of 0.01-2%.

10. The polishing composition of claim 4, wherein the surfactant comprises a compound of formula (II):

$$R^1-O-[CH_2CH(CH_3)O]_m-[CH_2CH_2O]_n-H \quad (II)$$

wherein $R^1$ is a $C_1$-$C_{10}$ alkyl, m and n are chosen such that in the compound of formula II, oxyethylene and oxypropylene groups are present in a 1:1 amount by weight to a 3:1 amount by weight.

11. A method of polishing, the method comprising polishing Co and optionally Cu with a composition comprising an abrasive and one or more Co complexors, wherein
the polishing composition has pH of 9 or more, and
the Co complexor comprises one or more of functional groups selected from phosphonic acid (—P(═O)(OH)$_2$) group or carboxylic (—C(═O)OH) group.

12. The method of claim 11, wherein a removal rate of Co is 200 angstrom/min to 2000 angstrom/min.

13. The method of claim 12, wherein a removal rate of Cu is less than 100 angstrom/min, or less than 80 angstrom/min.

14. The method of claim 13, wherein a Co:Cu removal selectivity is 5 or more.

15. The method of claim 11, wherein
the complexor comprises at least one phosphonic acid derivative,
the phosphonic acid derivative comprises at least one phosphonic acid (—P(═O)(OH)$_2$) group or a salt thereof each covalently attached independently by a bond or a linker to a core,
the core is selected from a heteroatom or a $C_1$-$C_{20}$ hydrocarbyl moiety, wherein the hydrocarbyl moiety is optionally substituted with 1-5 heteroatoms, optionally substituted with 1-5 hydroxyl groups, or optionally substituted with 1-5 heteroatoms and 1-5 hydroxyl groups,
the linker is a divalent or trivalent heteroatom or a divalent or trivalent $C_1$-$C_{20}$ hydrocarbyl moiety, wherein the hydrocarbyl moiety is optionally substituted with 1-5 heteroatoms, optionally substituted with 1-5 hydroxyl groups, or optionally substituted with 1-5 heteroatoms and 1-5 hydroxyl groups, and the heteroatom is independently selected from N, O, S, P and oxidized forms of N, S, and P.

16. The method of claim 15, wherein the phosphonic acid derivative further comprises at least one carboxyl group or a salt thereof.

17. The method of claim 16, wherein the phosphonic acid derivative is a compound of formula (I)

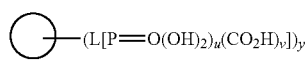

(I)

or a salt thereof, wherein

is the core, each L independently is a bond or a linker, wherein the core and the linker are defined as in claim 15, each u independently is 0-3, each v independently is 0-3, and y is 1-5; provided that the derivative contains at least one phosphonic acid group or a salt thereof.

18. The method of claim 15, wherein the core is a heteroatom.

19. The method of claim 15, wherein the core is a hydrocarbyl moiety selected from alkylenes optionally substituted with 1-3 hydroxyl groups.

20. The method of claim 11, wherein the complexor comprises at least one selected from a group of 2-Aminoethylphosphonic acid (AEPn), Dimethyl methylphosphonate (DMMP), 1-Hydroxy Ethylidene-1,1-Diphosphonic Acid (HEDP), Amino tris(methylene phosphonic acid) (ATMP), Ethylenediamine tetra(methylene phosphonic acid) (EDTMP), Tetramethylenediamine tetra(methylene phosphonic acid) (TDTMP), Hexamethylenediamine tetra(methylene phosphonic acid) (HDTMP), Diethylenetriamine penta(methylene phosphonic acid) (DTPMP), Phosphonobutane-tricarboxylic acid (PBTC), N-(phosphonomethyl)iminodiacetic acid (PMIDA), 2-carboxyethyl phosphonic acid (CEPA), 2-Hydroxyphosphonocarboxylic acid (HPAA), Amino-tris-(methylene-phosphonic acid) (AMP), N,N-bis(phosphonomethyl)glycine (glyphosine) (PMG), Iminodimethylenephosphonic acid (IDMP), and Ethylene Diamine Tetra (Methylene Phosphonic Acid) (EDTPO), and salts thereof.

21. The method of claim 11, wherein the complexor comprises at least one of citric acid, citric acid salt, ethylenediamine tetraacetic acid (EDTA), 2-hydroxyphosphonoacetic acid (HPAA), and amino tri(methylene phosphonic acid) (ATMP).

22. The method of claim 11, wherein the complexor is selected from citric acid, a citric acid salt, and EDTA.

23. The polishing composition of claim 1, wherein the Co complexor comprises 2-Aminoethylphosphonic acid (AEPn), Dimethyl methylphosphonate (DMMP), or Tetramethylenediamine tetra(methylene phosphonic acid) (TDTMP).

24. The polishing composition of claim 1, wherein the Co complexor comprises N-(phosphonomethyl)iminodiacetic acid (PMIDA), 2-carboxyethyl phosphonic acid (CEPA), or 2-Hydroxyphosphonocarboxylic acid (HPAA).

25. The polishing composition of claim 1, wherein the Co complexor comprises N,N-bis(phosphonomethyl)glycine (glyphosine) (PMG), Iminodimethylenephosphonic acid (IDMP), 2-hydroxyphosphonoacetic acid (HPAA), or amino tri(methylenephosphonic acid) (ATMP).

* * * * *

UNITED STATES PATENT AND TRADEMARK OFFICE
CERTIFICATE OF CORRECTION

PATENT NO. : 9,576,818 B2  
APPLICATION NO. : 14/192630  
DATED : February 21, 2017  
INVENTOR(S) : Miller et al.

Page 1 of 1

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 126 days.

Signed and Sealed this  
Ninth Day of January, 2018

Joseph Matal  
*Performing the Functions and Duties of the*  
*Under Secretary of Commerce for Intellectual Property and*  
*Director of the United States Patent and Trademark Office*